(12) United States Patent
Venkatraman et al.

(10) Patent No.: US 11,012,044 B2
(45) Date of Patent: May 18, 2021

(54) AMPLIFIER WITH COMMON MODE DETECTION

(71) Applicant: SENSATA TECHNOLOGIES, INC., Attleboro, MA (US)

(72) Inventors: Srinivasan Venkatraman, Natick, MA (US); William J. Walsh, Warwick, RI (US); Kousuke Nakamura, Foxborough, MA (US); Qichao Shao, Pawtucket, RI (US)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 20 days.

(21) Appl. No.: 16/135,078

(22) Filed: Sep. 19, 2018

(65) Prior Publication Data

US 2020/0091884 A1    Mar. 19, 2020

(51) Int. Cl.
*H03F 3/45* (2006.01)
*G01L 1/22* (2006.01)

(52) U.S. Cl.
CPC ........ *H03F 3/45932* (2013.01); *G01L 1/2262* (2013.01); *G01L 1/2287* (2013.01)

(58) Field of Classification Search
CPC ............. H03F 3/45932; H03F 3/45475; G01L 1/2262; G01L 1/2287
USPC .................................................. 73/774, 777
See application file for complete search history.

(56) References Cited

U.S. PATENT DOCUMENTS

| | | | | |
|---|---|---|---|---|
| 3,274,509 A | * | 9/1966 | Brown | H03F 3/45479 330/116 |
| 3,654,545 A | * | 4/1972 | Demark | G01L 1/2268 323/280 |
| 3,805,184 A | * | 4/1974 | Visioli, Jr. | G01K 7/245 331/65 |
| 5,159,159 A | * | 10/1992 | Asher | G01L 1/205 178/18.05 |
| 6,819,170 B1 | | 11/2004 | Kindt | |
| 7,103,013 B1 | * | 9/2006 | Kim | H04B 3/30 370/284 |
| 7,358,805 B2 | * | 4/2008 | Shia | G11C 7/062 330/258 |
| 7,385,443 B1 | | 6/2008 | Denison | |

(Continued)

FOREIGN PATENT DOCUMENTS

| | | |
|---|---|---|
| EP | 0677725 A1 | 10/1995 |
| JP | H0552677 A | 3/1993 |
| WO | 9321722 A1 | 10/1993 |

*Primary Examiner* — Octavia Hollington

(57) ABSTRACT

An analog discrete current mode negative feedback amplifier circuit for use with a micro-fused strain gauge is disclosed. The amplifier circuit includes a Wheatstone bridge coupled to a first power supply and a second power supply. The first power supply and the second power supply can be configured such that the periodically alternate between two voltage levels. The Wheatstone bridge can be coupled to a negative feedback amplifier circuit with common mode detection. The amplifier circuit can comprise a differential amplifier with a negative feedback configuration coupled to a common mode amplifier. In addition, the output of each of the amplifiers can be coupled to a common-mode amplifier. In a pressure sensing application, the output of the common mode amplifier serves to output the temperature while the differential amplifiers serve to output the pressure.

16 Claims, 3 Drawing Sheets

(56) References Cited

U.S. PATENT DOCUMENTS

| | | | |
|---|---|---|---|
| 7,893,766 B1 | 2/2011 | Cranford, Jr. et al. | |
| 8,138,833 B1 * | 3/2012 | Kumar | H03F 3/45183 330/258 |
| 8,884,699 B2 * | 11/2014 | Casiraghi | G01P 15/0802 330/258 |
| 9,429,479 B2 | 8/2016 | Millar et al. | |
| 9,910,073 B2 | 3/2018 | Joet et al. | |
| 2003/0095209 A1 * | 5/2003 | Zanten | H04N 5/18 348/572 |
| 2007/0163815 A1 | 7/2007 | Ungaretti et al. | |
| 2007/0257733 A1 * | 11/2007 | Laletin | G01R 31/3004 330/69 |
| 2014/0300415 A1 | 10/2014 | Casiraghi et al. | |
| 2016/0154031 A1 | 6/2016 | Masson et al. | |
| 2016/0377501 A1 | 12/2016 | Agarwal et al. | |
| 2017/0010723 A1 | 1/2017 | Smith et al. | |
| 2017/0350955 A1 | 12/2017 | Gentz et al. | |

\* cited by examiner

AMPLIFIER WITH COMMON MODE DETECTION

FIELD OF THE INVENTION

The present disclosure relates to electronic circuits. More particularly, this disclosure relates electronic circuits for use with sensors.

BACKGROUND OF THE INVENTION

A traditional electronic pressure sensor is a transducer that generates a signal as a function of the pressure imposed on the transducer. A pressure sensor is used in many different everyday applications to measure pressure of a gas or a liquid. The measurement of pressure can be of great importance in many different areas.

SUMMARY OF THE INVENTION

According to one embodiment, an analog discrete current mode negative feedback amplifier circuit for use with a micro-fused strain gauge is disclosed. The amplifier circuit includes a Wheatstone bridge coupled to a first power supply and a second power supply. The first power supply and the second power supply can be configured such that they periodically alternate between two voltage levels. The Wheatstone bridge can be coupled to a negative feedback amplifier circuit with common mode detection. The amplifier circuit can comprise two amplifiers in a differential configuration with each in a negative feedback configuration and each coupled to a common mode amplifier. Each of the amplifiers with the negative feedback configuration can have a low-pass filter configured on the negative feedback loop. In addition, the output of each of the amplifiers can be coupled to a common-mode amplifier. In a pressure sensing application, the output of the common mode amplifier serves to output the temperature while the differential amplifiers serve to output the pressure.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION

The present disclosure describes an electronic circuit that can be used with pressure transducers to form a pressure sensing circuit.

Figure 1:
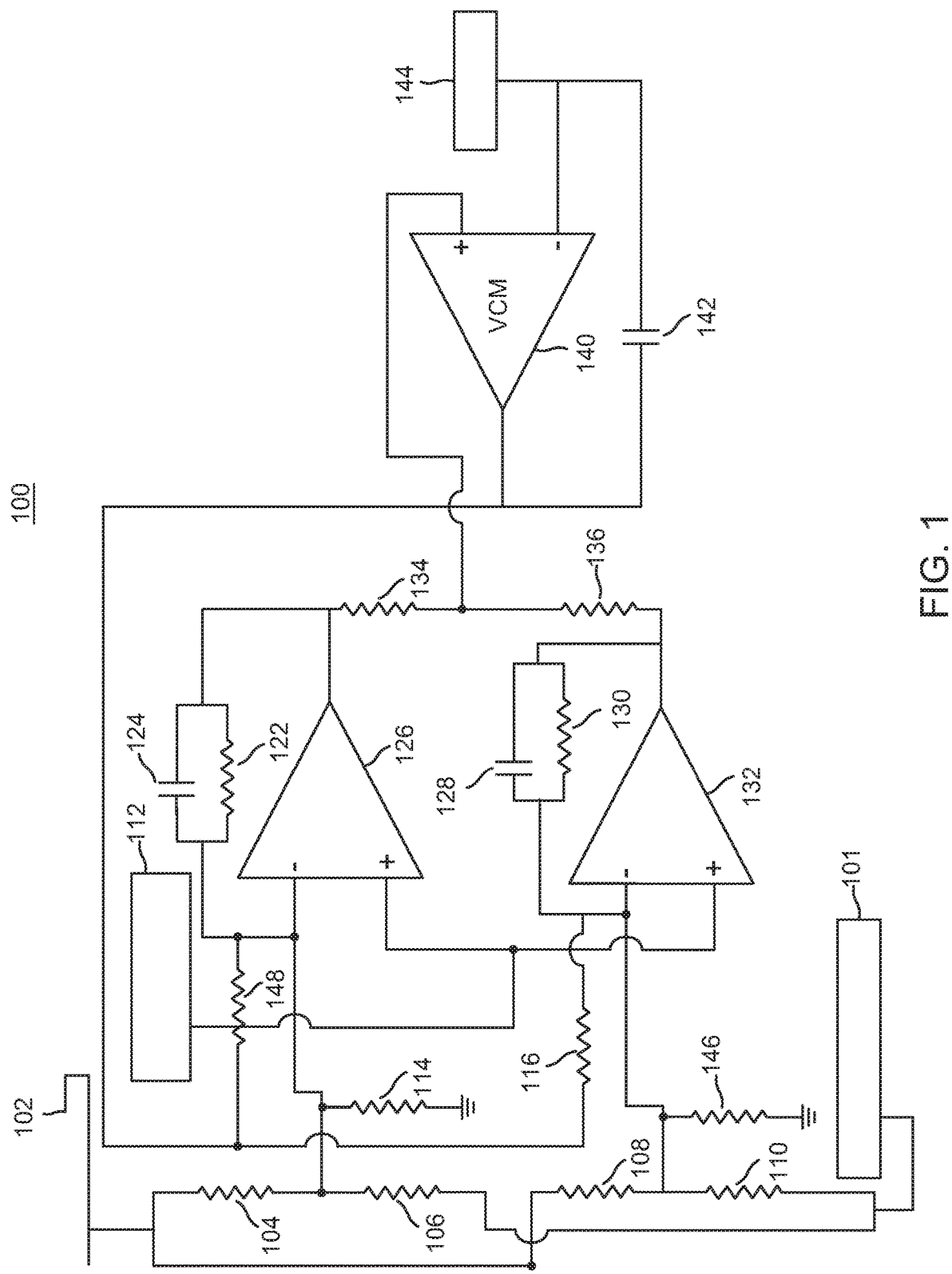
FIG. 1 is an illustrative circuit diagram of an amplifier circuit used with a transducer.

FIG. 1 shows an illustrative circuit diagram of a circuit 100 for use with pressure transducer to form a pressure sensing circuit. The operation of circuit 100 is as follows.

Resistors 104, 106, 108, and 110 form a Wheatstone bridge circuit. In some embodiments, each of resistors 104, 106, 108, and 110 are boron-doped silicon piezo resistors. Resistors 104, 106, 108, and 110 are configured as a full-bridge strain gauge.

A first power supply 101 is coupled between resistors 106 and 110. In some embodiments, the first power supply can have a voltage level of 0 volts. A second power supply 102 is coupled between resistors 104 and 108. In some embodiments, the second power supply can have a voltage level of 5 volts. A first power supply 101 is coupled between resistors 106 and 110. In some embodiments, the first power supply can have a voltage level of 5 volts. The configuration of resistors 104, 106, 108, and 110 is such that there is a 3 volt drop across each of resistors 104, 108 and 2V across 106, and 110.

In some embodiments, the voltage provided by the first power supply 101 and the second power supply 102 can vary in a periodic manner. For example, first supply can periodically switch from 0 volts to 5 volts while, at the same time, the second supply can switch from 5 volts to 0 volts. Such a switch can eliminate ionic drift. Ionic drift can occur due to prolonged exposure to high temperatures. Switching the power supplies 101 and 102 from a low voltage to a high voltage can lower the electric field of the resistors 104, 106, 108, and 110 (with reference to the system ground), thus preventing ionic drift. The switching between voltage levels can occur at a speed fast enough to prevent ionic drift. In some embodiments, the switching can occur as fast as once every 1.6 milliseconds.

An output of the Wheatstone bridge can be obtained from the coupling between resistor 104 and resistor 106. This output can be coupled to the inverting input of an amplifier 126. This coupling can include a resistor 114 coupled to ground to establish a current to give dynamic range to the detection circuit. In some embodiments, resistor 114 can have a value of 10,000 ohms. In some embodiments, this can establish a constant current of 200 µA, in conjunction with a reference voltage 112 of 2 volts which is coupled to a non-inverting input of amplifier 126. Another output of the Wheatstone bridge can be obtained from the coupling between resistor 108 and resistor 110. This output can be coupled to the inverting input of an amplifier 132. This coupling can include a resistor 146 coupled to ground to establish a current to give dynamic range to the detection circuit. In some embodiments, resistor 146 can have a value of 10,000 ohms. In some embodiments, this can establish a constant current of 200 µA, in conjunction with a reference voltage 112 of 2 volts which is coupled to a non-inverting input of amplifier 132. Resistors 114 and 146 also can serve as adjust the gain of amplifiers 126 and 132, respectively.

Each of amplifier 126 and 132 have a feedback loop. For example, a resistor 122 and a capacitor 124 can be coupled between the output of amplifier 126 and the inverting input of amplifier 126. In a similar manner, a resistor 130 and a capacitor 128 can be coupled between the output of amplifier 132 and the inverting input of amplifier 132. The combination of the capacitor and resistor forms a 1-pole low-pass filter. In some embodiments, capacitor 128 and capacitor 124 can have a value of 220 pico Farads (pF).

The outputs of amplifier 126 and 132 are also coupled to a common mode amplifier 140 at the non-inverting input. Amplifier 126 is coupled to amplifier 140 through resistor 134 and amplifier 132 is coupled to amplifier 140 through resistor 136. In some embodiments, resistor 134 and resistor 136 have the same resistance. In some embodiments, that resistance is 10,000 ohms.

Amplifier 140 has a capacitor 142 coupled from the output of amplifier 140 to the inverting input of amplifier 140. In some embodiments, the capacitance of capacitor 142 is approximately 100 pF. Capacitor 140 may be configured to provide a bandwidth limitation for the signal of amplifier 140. A power supply 144 is coupled to the inverting input of amplifier 140. In some embodiments, power supply 144 has a voltage of one-half the supply voltage. In some embodiments, one-half the supply voltage is 2.5 volts. This supply voltage forms a "virtual ground." The output of amplifier 140 is coupled to the inverting input of amplifier 126 via resistor 148. The output of amplifier 140 is coupled to the inverting input of amplifier 132 via resistor 116. In some embodiments, the resistance of resistors 148 and 116 can be used to set the dynamic range of amplifier 140. In some embodiments, the resistance of resistors 148 and 116 are each 8,000 ohms.

In some embodiments, each of amplifiers 126, 132, and 140 serves a different purpose. For example, amplifier 140 is a common mode amplifier. When circuit 100 is coupled to a pressure transducer, amplifier 140 can be configured to measure temperature. Amplifiers 126 and 132 form a differential amplifier. When circuit 100 is coupled to a pressure transducer, amplifiers 126 and 132 can be configured to measure pressure. In some embodiments, each of amplifiers 126, 132, and 140 have similar characteristics. In some embodiments, while amplifiers 126 and 132 have similar characteristics, amplifier 140 has a lower bandwidth than amplifiers 126 and 132.

It also should be understood that, while the operation of circuit 100 has been described with respect to pressure sensors, embodiments of circuit 100 can be used with any sort of transducer that can utilize a Wheatstone bridge to read the transducer. For example, any type of strain gauge can be used with various embodiments.

Embodiments of circuit 100 result in a circuit that has common mode detection for the high temperature sensitivity of a micro fused strain gauge. Thus, the temperature of the strain gauge can be determined and used to fine tune any pressure readings of the micro strain gauge. In some embodiments, amplifier 140 can be used to re-bias the differential amplifier to apply maximum gain to the differential amplifiers 126 and 132. In addition, circuit 100 has a high enough sensitivity and gain to amplify a small ratio change on the order to 2 to 3 percent for each half bridge of the Wheatstone bridge.

Figure 2:
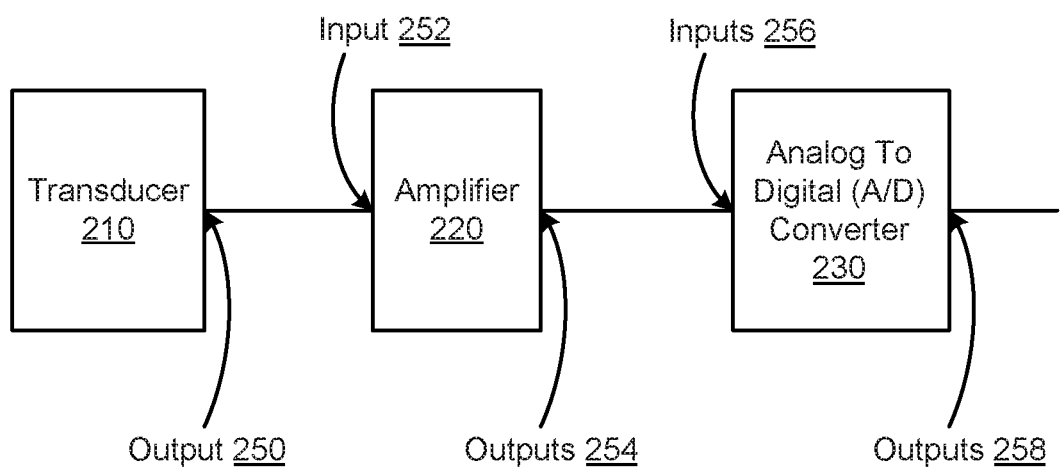
FIG. 2 is an illustrative block diagram of how the amplifier circuit is used with a transducer.

It should be understood that circuit 100 is merely one portion of a sensing circuit. With reference to FIG. 2, a block diagram showing an illustrative use case of the above-disclosed amplifier is presented. Transducer 210 can be any type of transducer. While some of the use cases described above were with respect to a pressure transducer, it should be understood that a variety of different types of transducers can be used in various embodiments. In typical embodiments, transducer 210 generates at output 250, a voltage output based on a property being measured. Illustrative properties can include pressure, temperature, strain, and the like. The output 250 of transducer 210 is coupled to an input 252 of amplifier 220. In some embodiments, amplifier 220 can be embodied as the amplifier of circuit 100.

Amplifier 220 serves to amplify the signals generated by transducer 210. In some embodiments, the signal generated by transducer 210 can create multiple signals from amplifier 220. As described above, a pressure transducer can output both pressure (from a differential amplifier) and temperature (from a common mode amplifier). The outputs 254 of amplifier 220 are coupled to inputs 256 of an analog to digital (A/D) converter 230. A/D converter 230 can be configured to translate voltage signals generated by amplifier 220 (such as a common mode voltage and/or differential voltage from amplifiers) into digital signals at outputs 258. The digital signals can be used by any other device. Digital signals can be more easily manipulated and are less susceptible to noise, making them easier to transmit to other devices for use.

Figure 3:
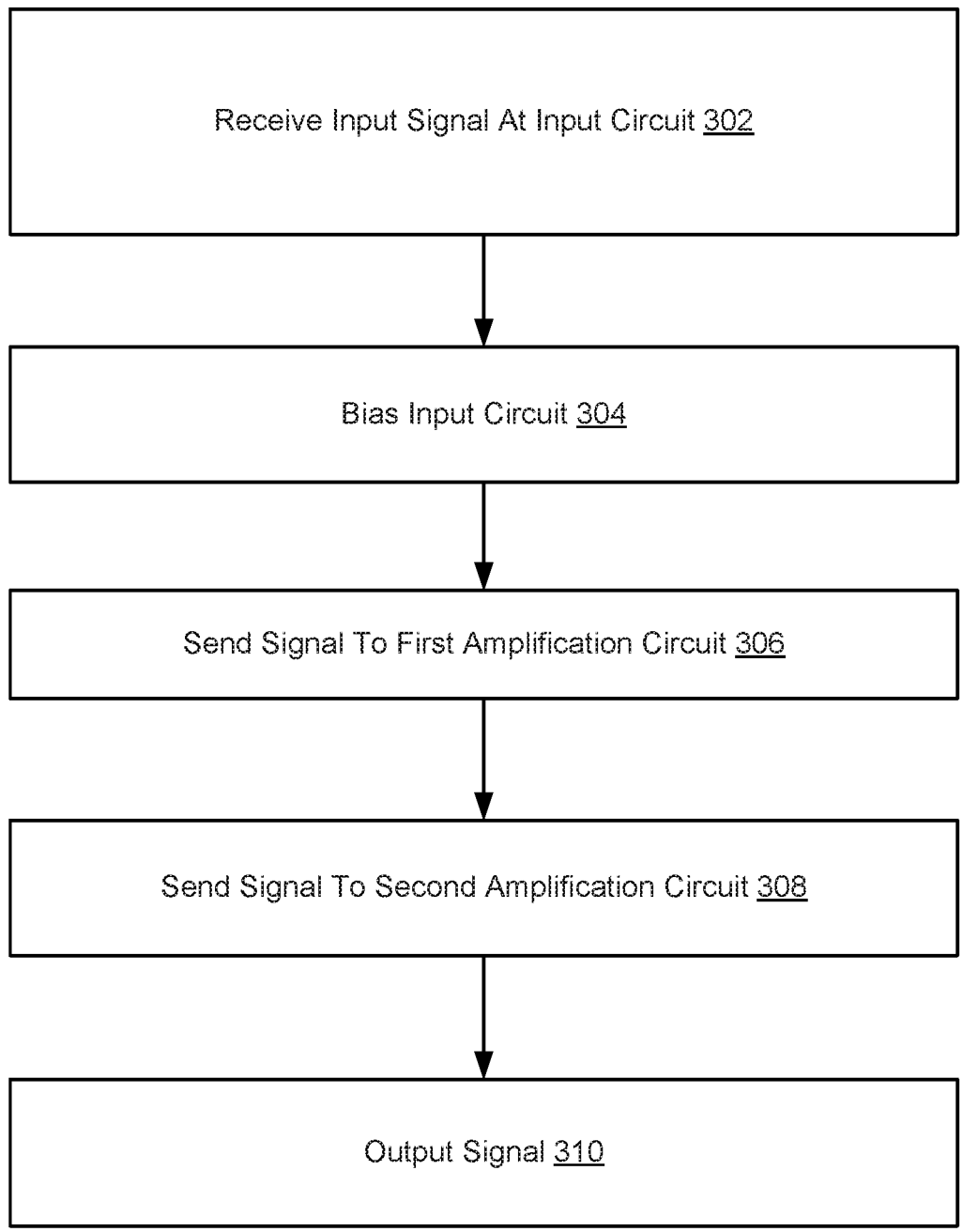
FIG. 3 is a flowchart illustrating the operations performed on a signal from a transducer.

With reference to FIG. 3, a flowchart 300 describing the operation of circuit 100 is presented. At step 302, a signal is received at an input circuit. In some embodiments, the input circuit is a bridge circuit. In some embodiments, the bridge circuit can be a Wheatstone bridge circuit. At step 304, the input circuit is biased by a supply voltage. The supply voltage may be in the form of two different supply voltages, a high value and a low value. Each of the supplies alternate between the high value and the low value in an attempt to reduce ionic drift of the bridge circuit.

At step 306, the signal from the bridge is then sent to a first amplification circuit. In some embodiments, the first amplification circuit is a differential pair of amplifiers. Each of the pair of amplifiers may be in a negative feedback configuration. At step 308, the signal is sent to a second amplification circuit (block 308). In some embodiments, the second amplification circuit is a common mode amplifier. The signal may be coupled to a non-inverting input of the second amplification circuit. The second amplification circuit may be coupled to the negative feedback loop of the first amplification circuit.

At step 310, the output of the first amplification circuit and the second amplification circuit may then be output. In some embodiments, the output is to an analog/digital converter. The output of the first amplification circuit and the output of the second amplification circuit each may be sent to the analog/digital converter. In some embodiments, the output of the first amplification circuit can represent a pressure reading from a pressure transducer, while the output of the second amplification circuit can represent a temperature reading from a pressure transducer.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words defining orientation such as "upper", and "lower" are merely used to help describe the location of components with respect to one another. For example, an "upper" surface of a part is merely meant to describe a surface that is separate from the "lower" surface of that same part. No words denoting orientation are used to describe an absolute orientation (i.e., where an "upper" part must always be on top).

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may be dependent from any or all claims in a multiple dependent manner even though such has not been originally claimed.

What is claimed is:

1. A system for amplifying signals from a transducer comprising:
   a Wheatstone bridge configuration of resistors;
   a differential amplifier coupled to the Wheatstone bridge configuration of resistors, the differential amplifier in a negative feedback configuration;
   a common-mode amplifier with an inverting input, a non-inverting input, and an output, the non-inverting input of the common-mode amplifier coupled to the output of the differential amplifier, the inverting input of the common-mode amplifier coupled to the output of the common-mode amplifier with a capacitor, wherein the common-mode amplifier is configured to fine-tune a gain of the differential amplifier.

2. The system of claim 1, wherein:
   the differential amplifier comprises:
      a first amplifier with an inverting input, a non-inverting input, and an output; and
      a second amplifier with an inverting input, a non-inverting input, and an output; wherein:
         the output of the first amplifier is coupled to the inverting input of the first amplifier; and
         the output of the second amplifier is coupled to the inverting input of the second amplifier.

3. The system of claim 2, wherein:
   the output of the first amplifier is coupled to the inverting input of the first amplifier utilizing negative feedback to make it a first low-pass filter; and
   the output of the second amplifier is coupled to the inverting input of the second amplifier utilizing negative feedback to make it a second low-pass filter.

4. The system of claim 3, wherein:
   the first low-pass filter comprises a capacitor coupled in parallel with a resistor; and
   the second low-pass filter comprises a capacitor coupled in parallel with a resistor.

5. The system of claim 2, wherein:
   a first power supply is coupled to the Wheatstone bridge; and
   a second power supply is coupled to the Wheatstone bridge; wherein:
      the first power supply is configured to periodically vary between a high value to a low value;
      the second power supply is configured to periodically vary between the low value to the high value; and
      the first power supply and the second power supply to never have the same voltage.

6. The system of claim 5, further comprising:
   a third power supply with a voltage level of one-half the high value; wherein:
      the third power supply is coupled to the non-inverting input of the first amplifier and to the non-inverting input of the second amplifier.

7. The system of claim 1, wherein:
   the Wheatstone bridge is configured to receive an input from a transducer;
   the differential amplifier is configured to output a signal based on a pressure sensed by the transducer; and
   the common mode amplifier is configured to output a signal based on a temperature sensed by the transducer.

8. The system of claim 7, wherein:
   the common mode amplifier is further configured to bias the differential amplifier based on the temperature sensed by the transducer.

9. An amplifier circuit for amplifying signals from a transducer comprising:
   a Wheatstone bridge configuration of resistors;
   a differential amplifier coupled to the Wheatstone bridge configuration of resistors, the differential amplifier in a negative feedback configuration;
   a common-mode amplifier with an inverting input, a non-inverting input, and an output, the non-inverting input of the common-mode amplifier coupled to the output of the differential amplifier, the inverting input of the common-mode amplifier coupled to the output of the common-mode amplifier with a capacitor, wherein the common-mode amplifier is configured to fine-tune a gain of the differential amplifier.

10. The amplifier circuit of claim 9, wherein:
    the differential amplifier comprises:
       a first amplifier with an inverting input, a non-inverting input, and an output; and
       a second amplifier with an inverting input, a non-inverting input, and an output; wherein:
          the output of the first amplifier is coupled to the inverting input of the first amplifier; and
          the output of the second amplifier is coupled to the inverting input of the second amplifier.

11. The amplifier circuit of claim 10, wherein:
    the output of the first amplifier is coupled to the inverting input of the first amplifier utilizing negative feedback to make it a first low-pass filter; and
    the output of the second amplifier is coupled to the inverting input of the second amplifier utilizing negative feedback to make it a second low-pass filter.

12. The amplifier circuit of claim 11, wherein:
    the first low-pass filter comprises a capacitor coupled in parallel with a resistor; and
    the second low-pass filter comprises a capacitor coupled in parallel with a resistor.

13. The amplifier circuit of claim 10, wherein:
    a first power supply is coupled to the Wheatstone bridge; and
    a second power supply is coupled to the Wheatstone bridge; wherein:
       the first power supply is configured to periodically vary between a high value to a low value;
       the second power supply is configured to periodically vary between the low value to the high value; and
       the first power supply and the second power supply to never have the same voltage.

14. The amplifier circuit of claim 13, further comprising:
    a third power supply with a voltage level of one-half the high value; wherein:
       the third power supply is coupled to the non-inverting input of the first amplifier and to the non-inverting input of the second amplifier.

15. The amplifier circuit of claim 9, wherein:
    the Wheatstone bridge is configured to receive an input from a transducer;
    the differential amplifier is configured to output a signal based on a pressure sensed by the transducer; and
    the common mode amplifier is configured to output a signal based on a temperature sensed by the transducer.

16. The amplifier circuit of claim 15, wherein:
the common mode amplifier is further configured to bias the differential amplifier based on the temperature sensed by the transducer.

* * * * *